US010055131B2

(12) United States Patent
Shin

(10) Patent No.: US 10,055,131 B2
(45) Date of Patent: Aug. 21, 2018

(54) DATA PROCESSING SYSTEM OF EFFICIENTLY PROCESSING DATA IN A PLURALITY OF MEMORY SYSTEMS AND OPERATING METHOD OF CONTROLLING DATA PROCESSING SYSTEM

(71) Applicant: SK hynix Inc., Gyeonggi-do (KR)

(72) Inventor: Beom-Ju Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 8 days.

(21) Appl. No.: 15/270,884

(22) Filed: Sep. 20, 2016

(65) Prior Publication Data

US 2017/0293430 A1    Oct. 12, 2017

(30) Foreign Application Priority Data

Apr. 6, 2016  (KR) .......................... 10-2016-0042423

(51) Int. Cl.
| | |
|---|---|
| *G06F 12/00* | (2006.01) |
| *G06F 3/06* | (2006.01) |
| *G06F 12/02* | (2006.01) |
| *G06F 11/10* | (2006.01) |
| *G11C 29/52* | (2006.01) |

(52) U.S. Cl.
CPC .......... *G06F 3/0604* (2013.01); *G06F 3/0659* (2013.01); *G06F 3/0665* (2013.01); *G06F 3/0679* (2013.01); *G06F 12/0246* (2013.01); *G06F 11/1068* (2013.01); *G06F 2212/214* (2013.01); *G06F 2212/403* (2013.01); *G06F 2212/7201* (2013.01); *G06F 2212/7208* (2013.01); *G11C 29/52* (2013.01)

(58) Field of Classification Search
CPC .. G06F 3/0604; G06F 12/0246; G06F 3/0679; G06F 3/0665; G06F 3/0659; G06F 11/1068; G06F 2212/7208; G06F 2212/7201; G06F 2212/403; G06F 2212/214; G11C 29/52
USPC ....................................................... 711/103
See application file for complete search history.

(56) References Cited

U.S. PATENT DOCUMENTS

| | | | | |
|---|---|---|---|---|
| 7,996,642 | B1 * | 8/2011 | Smith ................ | G06F 12/0246 711/154 |
| 8,650,438 | B2 | 2/2014 | Huang et al. | |
| 8,688,878 | B1 * | 4/2014 | Dolan .................... | G06F 3/061 710/33 |
| 9,201,789 | B1 * | 12/2015 | Kang .................. | G06F 12/0246 |

(Continued)

FOREIGN PATENT DOCUMENTS

KR    101554550    9/2015

*Primary Examiner* — Tuan Thai
*Assistant Examiner* — Tasnima Matin
(74) *Attorney, Agent, or Firm* — IP & T Group LLP

(57) ABSTRACT

A data processing system may include: a first memory system including a first memory device, and a first controller of the first memory device; and a second memory system including a second memory device, and a second controller of the second memory device, the first memory system may receive a command from a host, and then checks time information included in the command and performs a first update operation for the first memory device for a first time corresponding to the time information, and the second memory system may perform a second update operation for the second memory device for the first time for which the first update operation is performed.

14 Claims, 9 Drawing Sheets

(56) References Cited

U.S. PATENT DOCUMENTS

2014/0032820 A1* 1/2014 Harasawa ........... G06F 12/0246
711/103
2016/0342365 A1* 11/2016 Nosaka ................. G06F 3/0659

* cited by examiner

DATA PROCESSING SYSTEM OF EFFICIENTLY PROCESSING DATA IN A PLURALITY OF MEMORY SYSTEMS AND OPERATING METHOD OF CONTROLLING DATA PROCESSING SYSTEM

CROSS-REFERENCE TO RELATED APPLICATION

This application claims priority under 35 U.S.C. § 119(a) to Korean Patent Application No. 10-2016-0042423 filed on Apr. 6, 2016 in the Korean Intellectual Property Office, the disclosure of which is incorporated herein by reference in its entirety.

TECHNICAL FIELD

Exemplary embodiments relate generally to a data processing system and, more particularly, to a data processing system which processes data in a plurality of memory systems, and an operating method of the data processing system.

DISCUSSION OF THE RELATED ART

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices for storing data (i.e., a data storage device). The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

SUMMARY

Various embodiments are directed to a data processing system, which rapidly and stably processes data in a plurality of memory systems, and which is capable of maximizing efficiency in use of the plurality of memory systems, and an operating method of the data processing system.

In an embodiment, a data processing system may include: a first memory system including a first memory device, and a first controller; and a second memory system including a second memory device, and a second controller. The first memory system receives an operation command including time information from a host, checks the time information and performs a first update operation for the first memory device for a first time corresponding to the time information, and the second memory system performs a second update operation for the second memory device for the first time for which the first update operation is performed.

The first update operation may include an operation of updating map information for the first memory device by successively rearranging Logical Block Address (LBA) information for the first memory device.

The second update operation may include an operation of selecting, among a plurality of background operations for the second memory devices, at least one background operation, and performing the at least one background operation.

The second memory system may select the at least one background operation based on workloads and an order of priority for the background operations.

The second memory system may select, among the background operations, a first background operation and a second background operation that are capable of being completed for the first time, in accordance with the workloads, and the second memory system may perform, in accordance with the order of priority, the first background operation having a relatively high priority and then performs the second background operation having a relatively low priority.

In the case where, among the background operations, there is no background operation capable of being completed for the first time in according to the workloads, the second memory system may select a first background operation having the highest priority in accordance with the order of priority, and the second memory system may perform the first background operation for the first time.

The second memory system may stop the first background operation when the first time is ended, and may perform, for a next time capable of performing the second update operation, the stopped first background operation.

The background operations may Include a garbage collection operation, a wear leveling operation, and a map flush operation.

The host may be suitable for: checking the number of commands and a data size of command operations for the first memory system and the second memory system, generating the time information corresponding to the number of commands and the data size, and transmitting the operation command including operation information for the first and second memory systems and the time information, to each of the first and second memory systems.

The second memory system may receive the operation command from the host, checks the time information, and performs the second update operation for the first time.

In an embodiment, an operating method of a data processing system may include: transmitting a command including time information from a host to a first memory system including a first memory device and a first controller, and to a second memory system including a second memory device and a second controller; checking the time information; and performing a first update operation for the first memory device for a first time corresponding to the time information, and a second update operation for the second memory device for the first time for which the first update operation is performed.

The first update operation may include an operation of updating map information for the first memory device by successively rearranging Logical Block Address (LBA) information for the first memory device.

The second update operation may include an operation of selecting, among a plurality of background operations for the second memory devices, at least one background operation, and performing the at least one background operation.

The performing of the second update operation may include: selecting the at least one background operation based on workloads and an order of priority for the background operations.

The performing of the second update operation may include: selecting, among the background operations, a first background operation and a second background operation that are capable of being completed for the first time, in accordance with the workloads; and performing, in accordance with the order of priority, the first background operation having a relatively high priority, and then performing the second background operation having a relatively low priority.

The performing of the second update operation may include: selecting, in the case where, among the background operations, there is no background operation capable of being completed for the first time in according to the workloads, a first background operation having the highest priority in accordance with the order of priority; and performing the first background operation for the first time.

The operating method may further include: stopping the first background operation when the first time is ended; and performing, for a next time capable of performing the second update operation, the stopped first background operation.

The background operations may include a garbage collection operation, a wear leveling operation, and a map flush operation.

The operating method may further include: checking the number of commands and a data size of command operations for the first memory system and the second memory system; and generating the time information corresponding to the number of commands and the data size.

The transmitting of the command may include transmitting the command including operation information and the time information for the first memory system and the second memory system, to each of the first and second memory systems.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
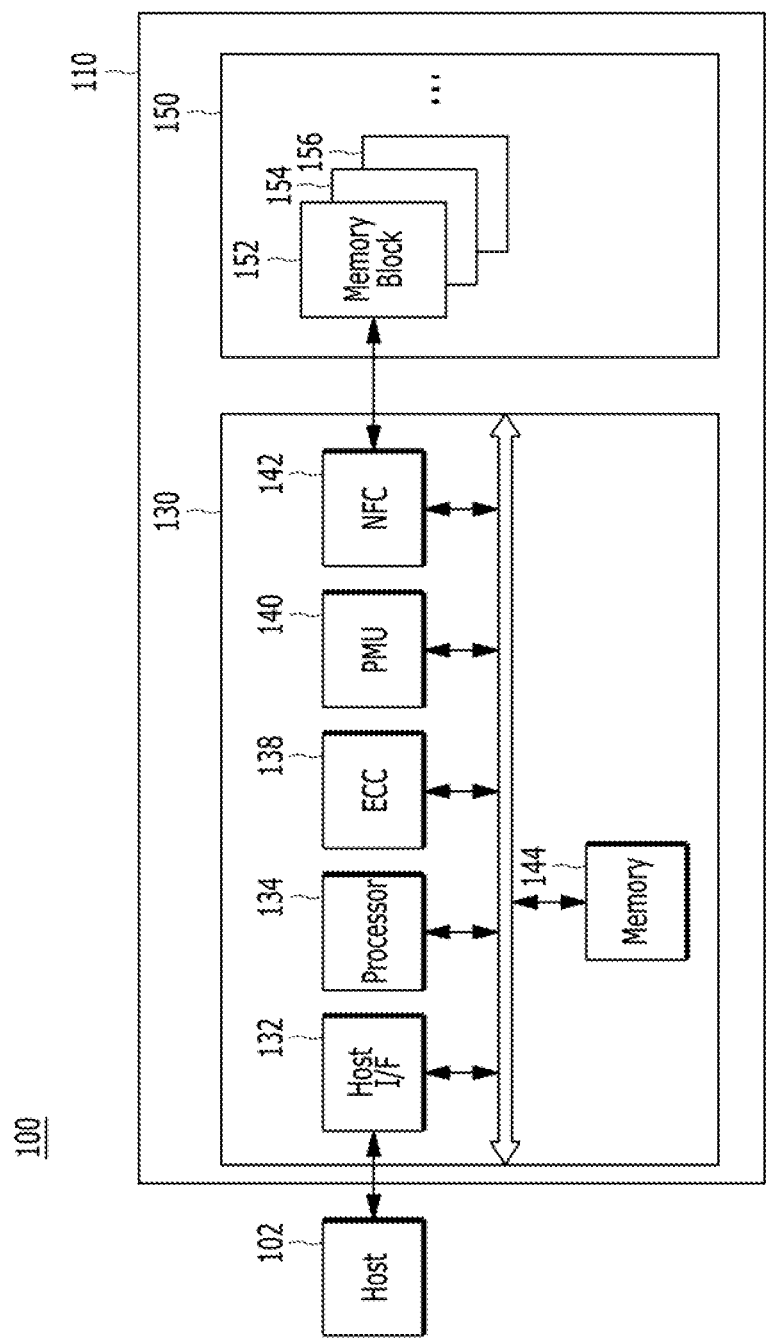
FIG. 1 is a diagram illustrating a data processing system including a memory system in accordance with an embodiment of the present invention.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "Includes", and "Including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a data processing system 100 including a memory system 110 in accordance with an embodiment of the present invention.

Referring to FIG. 1, the data processing system 100 may Include a host 102 and the memory system 110.

The host 102 may include a portable electronic device such as a mobile phone, an MP3 player and a laptop computer or a non-portable electronic device such as a desktop computer, a game player, a television (TV) and a projector.

The memory system 110 may operate in response to a request from the host 102, and in particular, store data to be accessed by the host 102. That is, the memory system 110 may be used as a main memory system or an auxiliary memory system of the host 102. The memory system 110 may be implemented with any one of various kinds of storage devices, according to the protocol of a host interface to be electrically coupled with the host 102. The memory system 110 may be implemented with any one of various kinds of storage devices such as a solid state drive (SSD), a multimedia card (MMC), an embedded MMC (eMMC), a reduced size MMC (RS-MMC) and a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and so forth.

The storage devices for the memory system 110 may be implemented with a volatile memory device such as a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The memory system 110 may include a memory device 150 which stores data to be accessed by the host 102, and a controller 130 which may control storage of data in the memory device 150.

The controller 130 and the memory device 150 may be Integrated into one semiconductor device. For instance, the controller 130 and the memory device 150 may be integrated into one semiconductor device and configure a solid state drive (SSD). When the memory system 110 is used as the SSD, the operation speed of the host 102 that is electrically coupled with the memory system 110 may be significantly increased.

The controller 130 and the memory device 150 may be integrated into one semiconductor device and configure a memory card. The controller 130 and the memory card 150 may be integrated into one semiconductor device and configure a memory card such as a Personal Computer Memory Card International Association (PCMCIA) card, a compact flash (CF) card, a smart media (SM) card (SMC), a memory stick, a multimedia card (MMC), an RS-MMC, a micro-MMC, a secure digital (SD) card, a mini-SD, a micro-SD, an SDHC, and a universal flash storage (UFS) device.

For another instance, the memory system 110 may configure a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when a power supply is interrupted and, in particular, store the data provided from the host 102 during a write operation, and provide stored data to the host 102 during a read operation. The memory device 150 may include a plurality of memory blocks 152, 154 and 156. Each of the memory blocks 152, 154 and 156 may include a plurality of pages. Each of the pages may include a plurality of memory cells to which a plurality of word lines (WL) are electrically coupled. The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later in detail with reference to FIGS. 2 to 11.

The controller 130 of the memory system 110 may control the memory device 150 in response to a request from the host 102. The controller 130 may provide the data read from the memory device 150, to the host 102, and store the data provided from the host 102 in the memory device 150. Therefore, the controller 130 may control overall operations of the memory device 150, such as read, write, program and erase operations.

In detail, the controller 130 may include a host interface unit 132, a processor 134, an error correction code (ECC) unit 138, a power management unit (PMU) 140, a NAND flash controller (NFC) 142, and a memory 144.

The host interface unit 132 may process commands and data provided from the host 102, and may communicate with the host 102 through at least one of various interface protocols such as universal serial bus (USB), multimedia card (MMC), peripheral component Interconnect-express (PCI-E), serial attached SCSI (SAS), serial advanced technology attachment (SATA), parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal Indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. For example, the NFC 142 may generate control signals for the memory device 150 and process data under the control of the processor 134 when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host 102. The processor 134 may drive firmware, which is referred to as a flash translation layer (FTL), to control the general operations of the memory system 110. For example, the processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory (e.g., a NAND flash memory), a program failure may occur during the write operation (or program operation), due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 100, and thus reliable bad block management is required.

Figure 2:
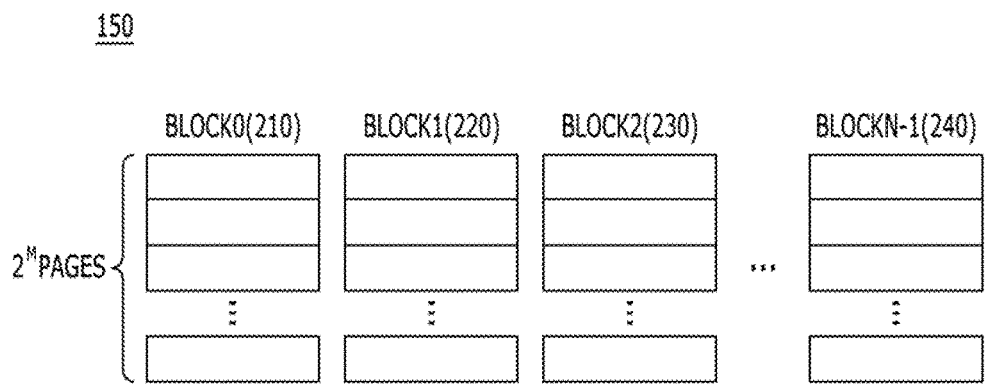
FIG. 2 is a diagram illustrating a memory device in the memory system shown in FIG. 1.

FIG. 2 is a schematic diagram illustrating the memory device 150 shown in FIG. 1.

Referring to FIG. 2, the memory device 150 may include a plurality of memory blocks. For example, the memory device 150 may include zeroth to $(N-1)^{th}$ blocks 210 to 240. Each of the plurality of memory blocks 210 to 240 may include a plurality of pages. For example, each of the plurality of memory blocks 210 to 240 may include $2^M$ number of pages ($2^M$ PAGES), to which the present invention will not be limited. Each of the plurality of pages may include a plurality of memory cells to which a plurality of word lines are electrically coupled.

Additionally, the memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data (e.g., two or more-bit data). An MLC memory block including a plurality of pages which are implemented with memory cells that are each capable of storing 3-bit data may be defined as a triple level cell (TLC) memory block.

Each of the plurality of memory blocks 210 to 240 may store the data provided from the host 102 during a write operation, and may provide stored data to the host 102 during a read operation.

Figure 3:
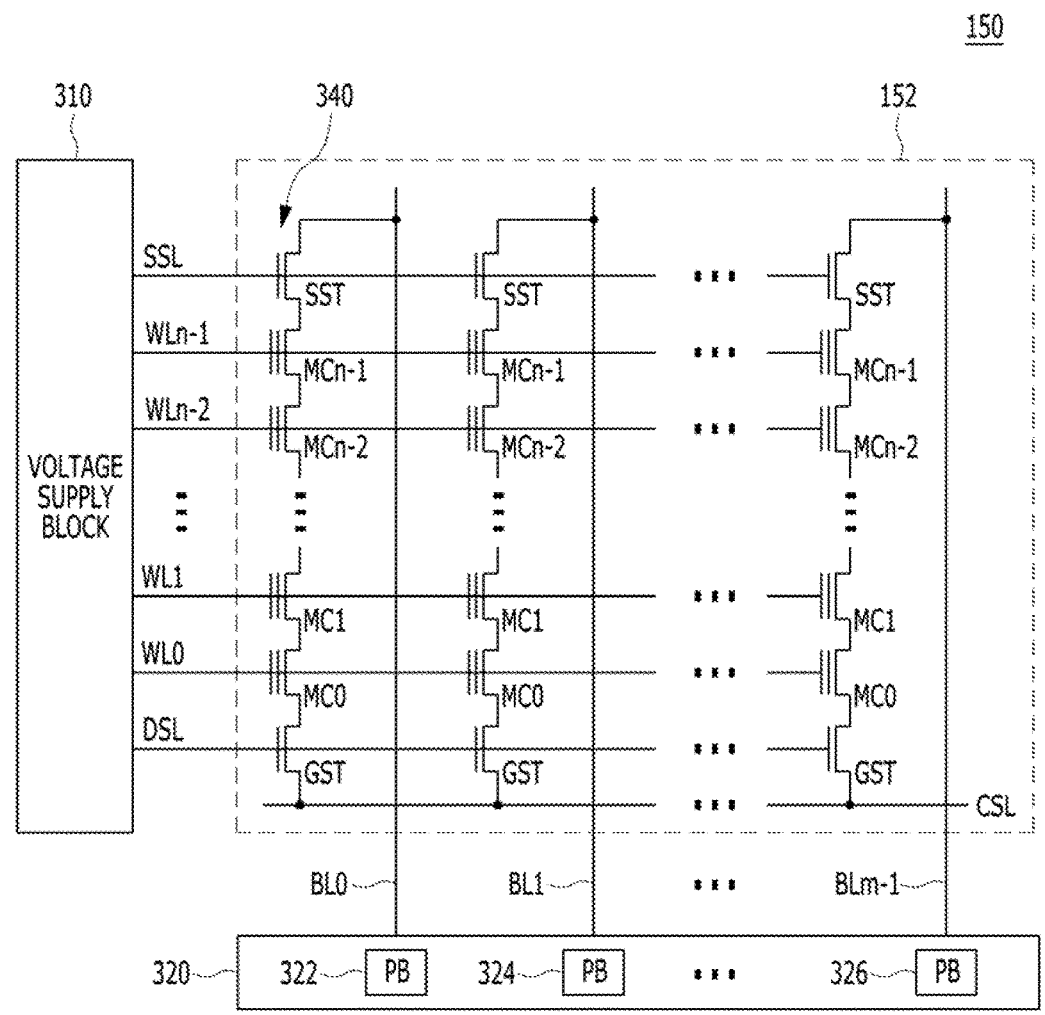
FIG. 3 is a circuit diagram illustrating a memory block in a memory device in accordance with an embodiment of the present invention.

FIG. 3 is a circuit diagram illustrating one of the plurality of memory blocks 152 to 156 shown in FIG. 1.

Referring to FIG. 3, the memory block 152 of the memory device 150 may include a plurality of cell strings 340 which are electrically coupled to bit lines BL0 to BLm-1, respectively. The cell string 340 of each column may include at least one drain select transistor DST and at least one source select transistor SST. A plurality of memory cells or a plurality of memory cell transistors MC0 to MCn-1 may be electrically coupled in series between the select transistors DST and SST. The respective memory cells MC0 to MCn-1 may be configured by multi-level cells (MLC) each of which stores data information of a plurality of bits. The strings 340 may be electrically coupled to the corresponding bit lines BL0 to BLm-1, respectively. For reference, in FIG. 3, 'DSL' denotes a drain select line, 'SSL' denotes a source select line, and 'CSL' denotes a common source line.

While FIG. 3 shows, as an example, the memory block 152 which is configured by NAND flash memory cells, it is to be noted that the memory block 152 of the memory device 150 in accordance with the embodiment is not limited to NAND flash memory cells and may be implemented with NOR flash memory cells, hybrid flash memory cells in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A voltage supply block 310 of the memory device 150 may provide word line voltages such as a program voltage, a read voltage and a pass voltage, to be supplied to respective word lines according to an operation mode and voltages to be supplied to bulks, for example, well regions in which the memory cells are formed. The voltage supply block 310 may perform a voltage generating operation under the control of a control circuit (not shown). The voltage supply block 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 150 may be controlled by the control circuit, and may serve as a sense amplifier or a write driver according to an operation mode. During a verification/normal read operation, the read/write circuit 320 may serve as a sense amplifier for reading data from the memory cell array. Additionally, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. The read/write circuit 320 may include a plurality of page buffers 322, 324 and 326 respectively corresponding to columns or bit lines, or pairs of columns or pairs of bit lines, and a plurality of latches (not shown) may be included in each of the page buffers 322, 324 and 326.

FIGS. 4 to 11 are diagrams illustrating the memory device 150 shown in FIG. 1.

Figure 4:
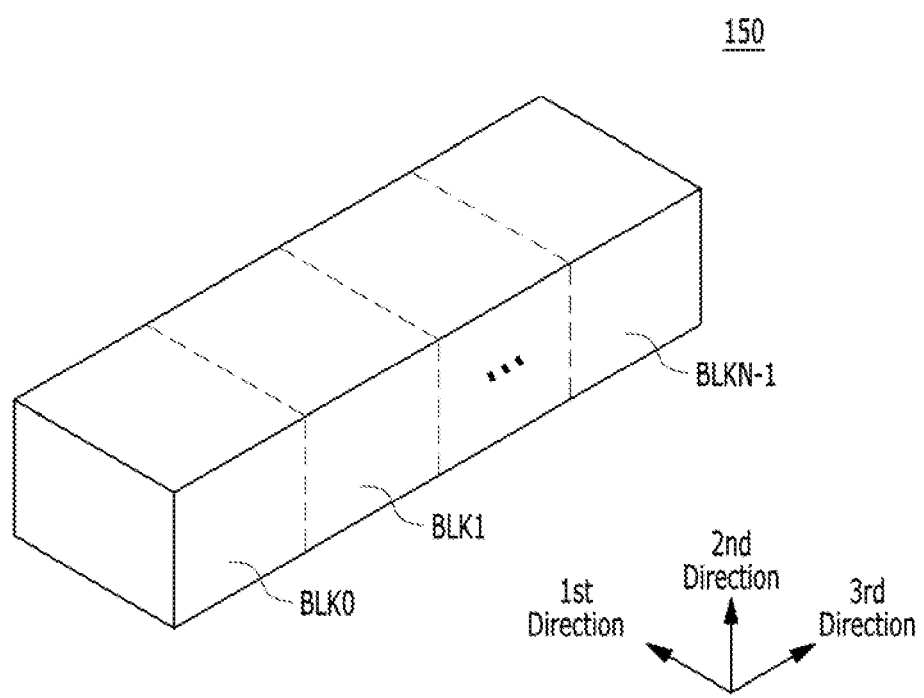
FIGS. 4 to 11 are diagrams illustrating the memory device shown in FIG. 2.

FIG. 4 is a block diagram illustrating an example of the plurality of memory blocks included in the memory device 150 shown in FIG. 1.

Referring to FIG. 4, the memory device 150 may include a plurality of memory blocks BLK0 to BLKN−1, and each of the memory blocks BLK0 to BLKN−1 may be realized in a three-dimensional (3D) structure or a vertical structure. The respective memory blocks BLK0 to BLKN−1 may include structures which extend in first to third directions (e.g., an x-axis direction, a y-axis direction and a z-axis direction).

The respective memory blocks BLK0 to BLKN−1 may include a plurality of NAND strings NS which extend in the second direction. The plurality of NAND strings NS may be provided in the first direction and the third direction. Each NAND string NS may be electrically coupled to a bit line BL, at least one source select line SSL, at least one ground select line GSL, a plurality of word lines WL, at least one dummy word line DWL, and a common source line CSL. That is, the respective memory blocks BLK0 to BLKN−1 may be electrically coupled to a plurality of bit lines BL, a plurality of source select lines SSL, a plurality of ground select lines GSL, a plurality of word lines WL, a plurality of dummy word lines DWL, and a plurality of common source lines CSL.

Figure 5:
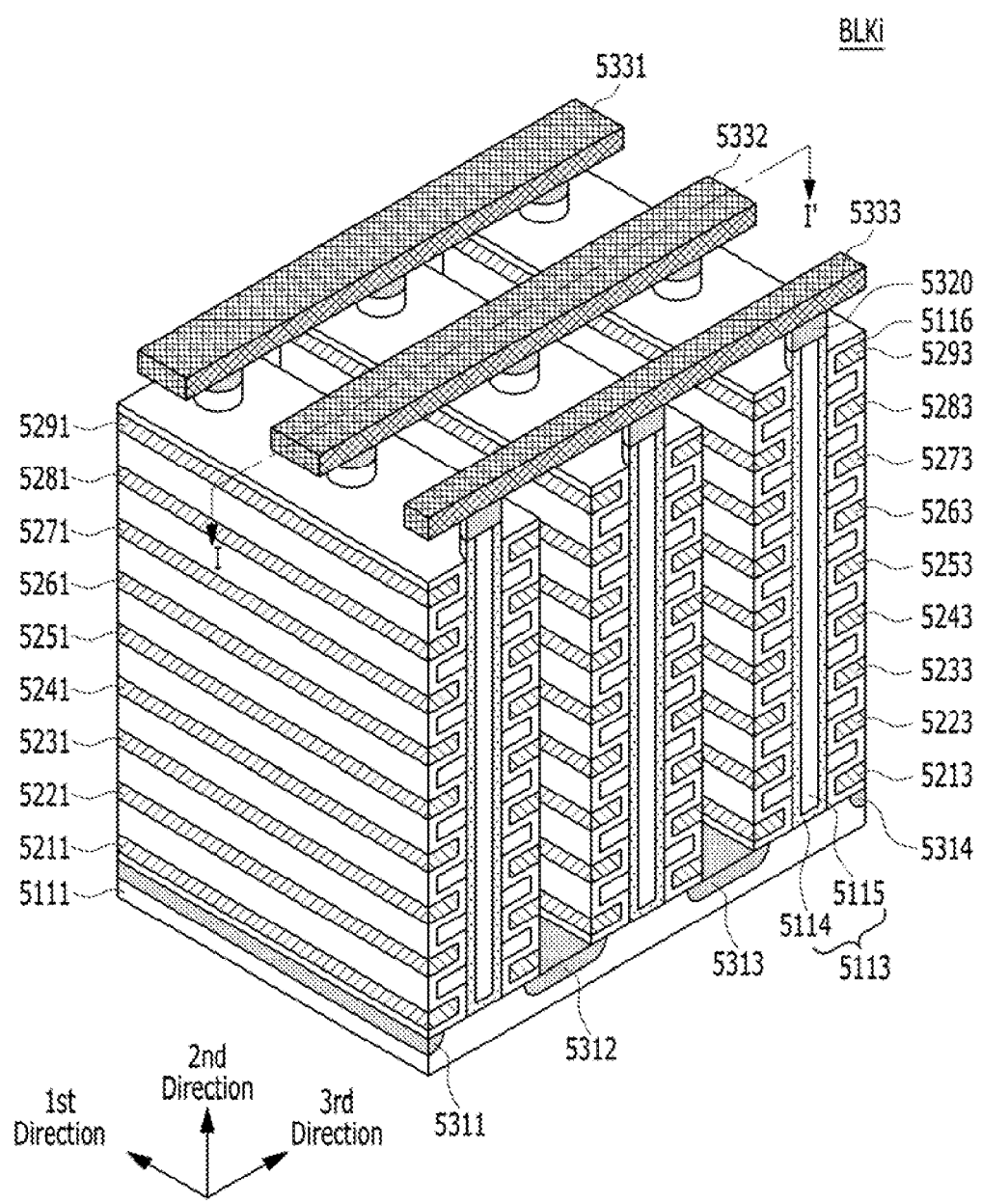
Figure 6:
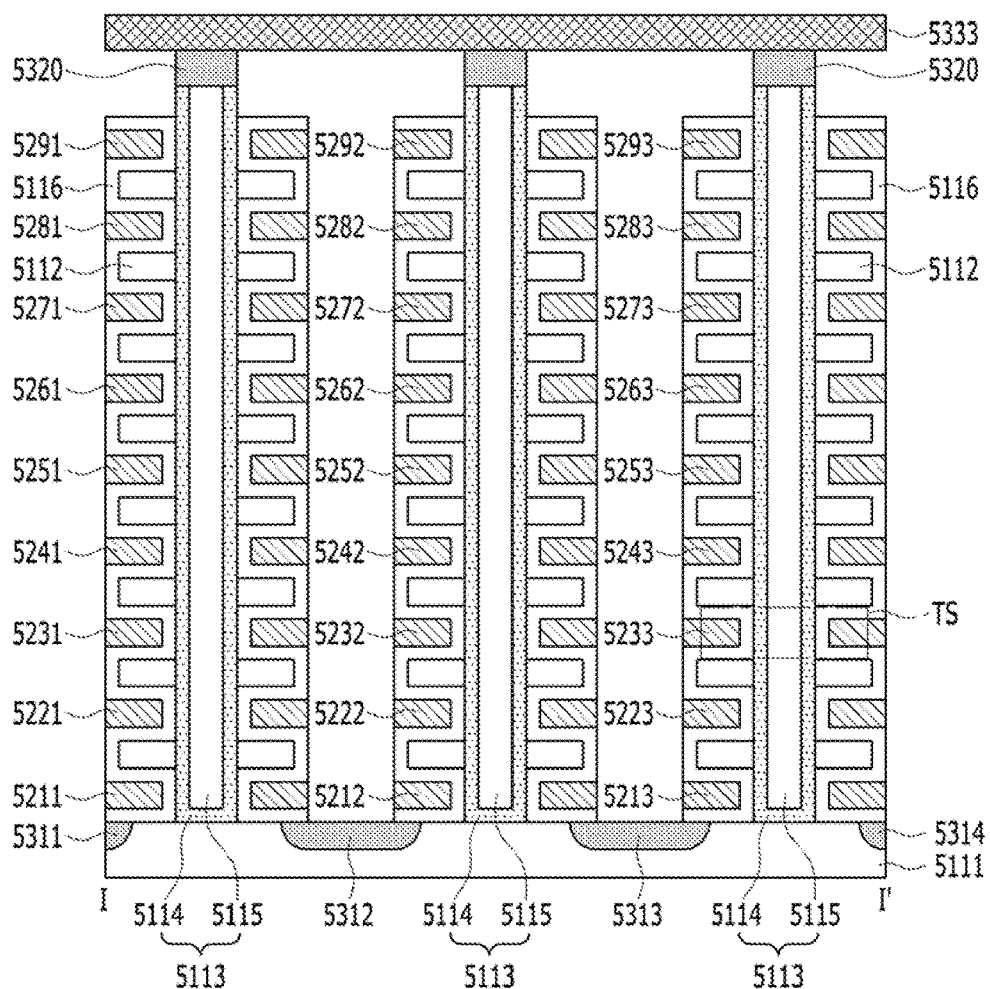

FIG. 5 is a perspective view of one BLKi of the plural memory blocks BLK0 to BLKN−1 shown in FIG. 4. FIG. 6 is a cross-sectional view taken along a line I-I' of the memory block BLKi shown in FIG. 5.

Referring to FIGS. 5 and 6, a memory block BLKi among the plurality of memory blocks of the memory device 150 may include a structure which extends in the first to third directions.

A substrate 5111 may be provided. The substrate 5111 may Include a silicon material doped with a first type impurity. The substrate 5111 may include a silicon material doped with a p-type impurity or may be a p-type well (e.g., a pocket p-well), and include an n-type well which surrounds the p-type well. While it is assumed that the substrate 5111 is p-type silicon, it is to be noted that the substrate 5111 is not limited to being p-type silicon.

A plurality of doping regions 5311 to 5314 which extend in the first direction may be provided over the substrate 5111. The plurality of doping regions 5311 to 5314 may contain a second type of impurity that is different from the substrate 5111. The plurality of doping regions 5311 to 5314 may be doped with an n-type impurity. Although in this embodiment the first to fourth doping regions 5311 to 5314 are n-type, it is to be noted that the first to fourth doping regions 5311 to 5314 are not limited to being n-type.

In the region over the substrate 5111 between the first and second doping regions 5311 and 5312, a plurality of dielectric materials 5112 which extend in the first direction may be sequentially provided in the second direction. The dielectric materials 5112 and the substrate 5111 may be separated from one another by a predetermined distance in the second direction. The dielectric materials 5112 may be separated from one another by a predetermined distance in the second direction. The dielectric materials 5112 may include a dielectric material such as silicon oxide.

In the region over the substrate 5111 between the first and second doping regions 5311 and 5312, a plurality of pillars 5113 which are sequentially disposed in the first direction and pass through the dielectric materials 5112 in the second direction may be provided. The plurality of pillars 5113 may respectively pass through the dielectric materials 5112 and may be electrically coupled with the substrate 5111. Each pillar 5113 may be configured by a plurality of materials. The surface layer 5114 of each pillar 5113 may include a silicon material doped with the first type of impurity. The surface layer 5114 of each pillar 5113 may include a silicon material doped with the same type of impurity as the substrate 5111. While it is assumed here that the surface layer 5114 of each pillar 5113 may include p-type silicon, the surface layer 5114 of each pillar 5113 is not limited to being p-type silicon.

An inner layer 5115 of each pillar 5113 may be formed of a dielectric material. The inner layer 5115 of each pillar 5113 may be filled by a dielectric material such as silicon oxide.

In the region between the first and second doping regions 5311 and 5312, a dielectric layer 5116 may be provided along the exposed surfaces of the dielectric materials 5112, the pillars 5113 and the substrate 5111. The thickness of the dielectric layer 5116 may be less than half of the distance between the dielectric materials 5112. That is, a region in which a material other than the dielectric material 5112 and the dielectric layer 5116 may be disposed, may be provided between (i) the dielectric layer 5116 provided over the bottom surface of a first dielectric material of the dielectric materials 5112 and (ii) the dielectric layer 5116 provided over the top surface of a second dielectric material of the dielectric materials 5112. The dielectric materials 5112 lie below the first dielectric material.

In the region between the first and second doping regions 5311 and 5312, conductive materials 5211 to 5291 may be provided over the exposed surface of the dielectric layer 5116. The conductive material 5211 which extends in the first direction may be provided between the dielectric material 5112 adjacent to the substrate 5111 and the substrate 5111. In particular, the conductive material 5211 which extends in the first direction may be provided between (i) the dielectric layer 5116 disposed over the substrate 5111 and (ii) the dielectric layer 5116 disposed over the bottom surface of the dielectric material 5112 adjacent to the substrate 5111.

The conductive material which extends in the first direction may be provided between (i) the dielectric layer 5116 disposed over the top surface of one of the dielectric materials 5112 and (ii) the dielectric layer 5116 disposed over the bottom surface of another dielectric material of the dielectric materials 5112, which is disposed over the certain dielectric material 5112. The conductive materials 5221 to 5281 which extend in the first direction may be provided between the dielectric materials 5112. The conductive material 5291 which extends in the first direction may be provided over the uppermost dielectric material 5112. The conductive materials 5211 to 5291 which extend in the first direction may be a metallic material. The conductive materials 5211 to 5291 which extend in the first direction may be a conductive material such as polysilicon.

In the region between the second and third doping regions 5312 and 5313, the same structures as the structures between the first and second doping regions 5311 and 5312 may be provided. For example, in the region between the second and third doping regions 5312 and 5313, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5212 to 5292 which extend in the first direction may be provided.

In the region between the third and fourth doping regions 5313 and 5314, the same structures as between the first and second doping regions 5311 and 5312 may be provided. For example, in the region between the third and fourth doping regions 5313 and 5314, the plurality of dielectric materials 5112 which extend in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5213 to 5293 which extend in the first direction may be provided.

Drains 5320 may be respectively provided over the plurality of pillars 5113. The drains 5320 may be silicon materials doped with second type impurities. The drains 5320 may be silicon materials doped with n-type impurities. Although in this embodiment the drains 5320 include n-type silicon, it is to be noted that the drains 5320 are not limited to being n-type silicon. Furthermore, the width of each drain 5320 may be larger than the width of each corresponding pillar 5113. Each drain 5320 may be provided in the shape of a pad over the top surface of each corresponding pillar 5113.

Conductive materials 5331 to 5333 which extend in the third direction may be provided over the drains 5320. The conductive materials 5331 to 5333 may be sequentially disposed in the first direction. The respective conductive materials 5331 to 5333 may be electrically coupled with the drains 5320 of corresponding regions. The drains 5320 and the conductive materials 5331 to 5333 which extend in the third direction may be electrically coupled with through contact plugs. The conductive materials 5331 to 5333 which extend in the third direction may be a metallic material. The conductive materials 5331 to 5333 which extend in the third direction may be a conductive material such as polysilicon.

In FIGS. 5 and 6, the respective pillars 5113 may form strings together with the dielectric layer 5116 and the conductive materials 5211 to 5291, 5212 to 5292 and 5213 to 5293 which extend in the first direction. The respective pillars 5113 may form NAND strings NS together with the dielectric layer 5116 and the conductive materials 5211 to 5291, 5212 to 5292 and 5213 to 5293 which extend in the first direction. Each NAND string NS may include a plurality of transistor structures TS.

Figure 7:
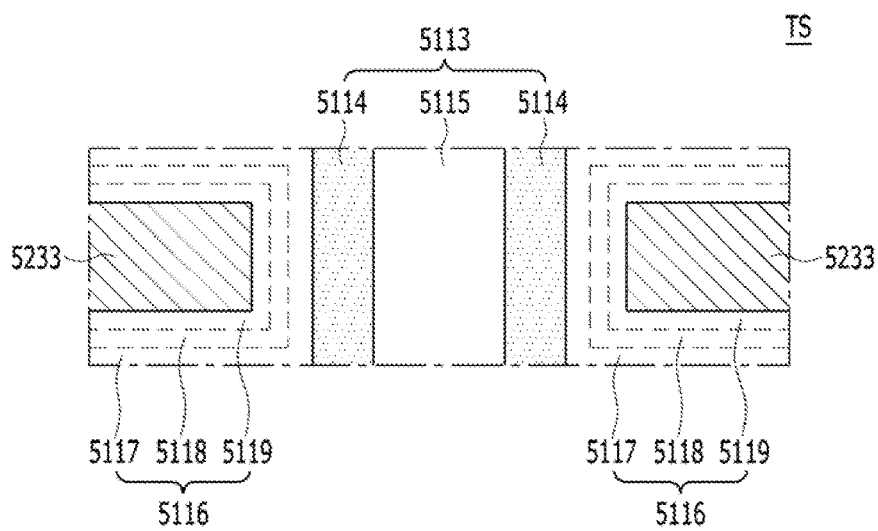

FIG. 7 is a cross-sectional view of the transistor structure TS shown in FIG. 6.

Referring to FIG. 7, in the transistor structure TS shown in FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. The second sub dielectric layer 5118 may serve as a charge capturing layer, and may include a nitride layer or a metal oxide layer such as an aluminum oxide layer, a hafnium oxide layer, or the like.

The third sub dielectric layer 5119 adjacent to the conductive material 5233 may serve as a blocking dielectric layer. The third sub dielectric layer 5119 adjacent to the conductive material 5233 which extends in the first direction may be formed as a single layer or multiple layers. The third sub dielectric layer 5119 may be a high-k dielectric layer such as an aluminum oxide layer, a hafnium oxide layer, or the like, which has a dielectric constant greater than the first and second sub dielectric layers 5117 and 5118.

The conductive material 5233 may serve as a gate or a control gate. That is, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, for the sake of convenience, the surface layer 5114 of p-type silicon in each of the pillars 5113 will be referred to as a body in the second direction.

The memory block BLKi may include the plurality of pillars 5113. That is, the memory block BLKi may include the plurality of NAND strings NS. In detail, the memory block BLKi may include the plurality of NAND strings NS which extend in the second direction or a direction perpendicular to the substrate 5111.

Each NAND string NS may include the plurality of transistor structures TS which are disposed in the second direction. At least one of the plurality of transistor structures TS of each NAND string NS may serve as a string source transistor SST. At least one of the plurality of transistor structures TS of each NAND string NS may serve as a ground select transistor GST.

The gates or control gates may correspond to the conductive materials 5211 to 5291, 5212 to 5292 and 5213 to 5293 which extend in the first direction. That is, the gates or the control gates may extend in the first direction and form word lines, at least two select lines, at least one source select line SSL and at least one ground select line GSL.

The conductive materials 5331 to 5333 which extend in the third direction may be electrically coupled to one end of the NAND strings NS. The conductive materials 5331 to 5333 which extend in the third direction may serve as bit lines BL. That is, in one memory block BLKi, the plurality of NAND strings NS may be electrically coupled to one bit line BL.

The second type doping regions 5311 to 5314 which extend in the first direction may be provided to the other ends of the NAND strings NS. The second type doping regions 5311 to 5314 which extend in the first direction may serve as common source lines CSL.

Furthermore, the memory block BLKi may include a plurality of NAND strings NS which extend in a direction perpendicular to the substrate 5111, such as, the second direction, and may serve as a NAND flash memory block, for example, of a charge capturing type memory, in which a plurality of NAND strings NS are electrically coupled to one bit line BL.

While it is illustrated in FIGS. 5 to 7 that the conductive materials 5211 to 5291, 5212 to 5292 and 5213 to 5293 which extend in the first direction are provided in 9 layers, it is to be noted that the conductive materials 5211 to 5291, 5212 to 5292 and 5213 to 5293 which extend in the first direction are not limited to being provided in 9 layers. For example, conductive materials which extend in the first direction may be provided in 8 layers, 16 layers or any multiple of layers. That is, in one NAND string NS, the number of transistors may be 8, 16 or more.

While it is Illustrated in FIGS. 5 to 7 that 3 NAND strings NS are electrically coupled to one bit line BL, it is to be noted that the embodiment is not limited to having 3 NAND strings NS that are electrically coupled to one bit line BL. In the memory block BLKi, m number of NAND strings NS may be electrically coupled to one bit line BL, m being a positive Integer. According to the number of NAND strings NS which are electrically coupled to one bit line BL, the number of conductive materials 5211 to 5291, 5212 to 5292 and 5213 to 5293 which extend in the first direction and the number of common source lines 5311 to 5314 may be controlled as well.

Further, while it is illustrated in FIGS. 5 to 7 that 3 NAND strings NS are electrically coupled to one conductive material which extends in the first direction, it is to be noted that the embodiment is not limited to having 3 NAND strings NS electrically coupled to one conductive material which extends in the first direction. For example, n number of NAND strings NS may be electrically coupled to one conductive material which extends in the first direction, n being a positive integer. According to the number of NAND strings NS which are electrically coupled to one conductive material which extends in the first direction, the number of bit lines 5331 to 5333 may be controlled as well.

Figure 8:
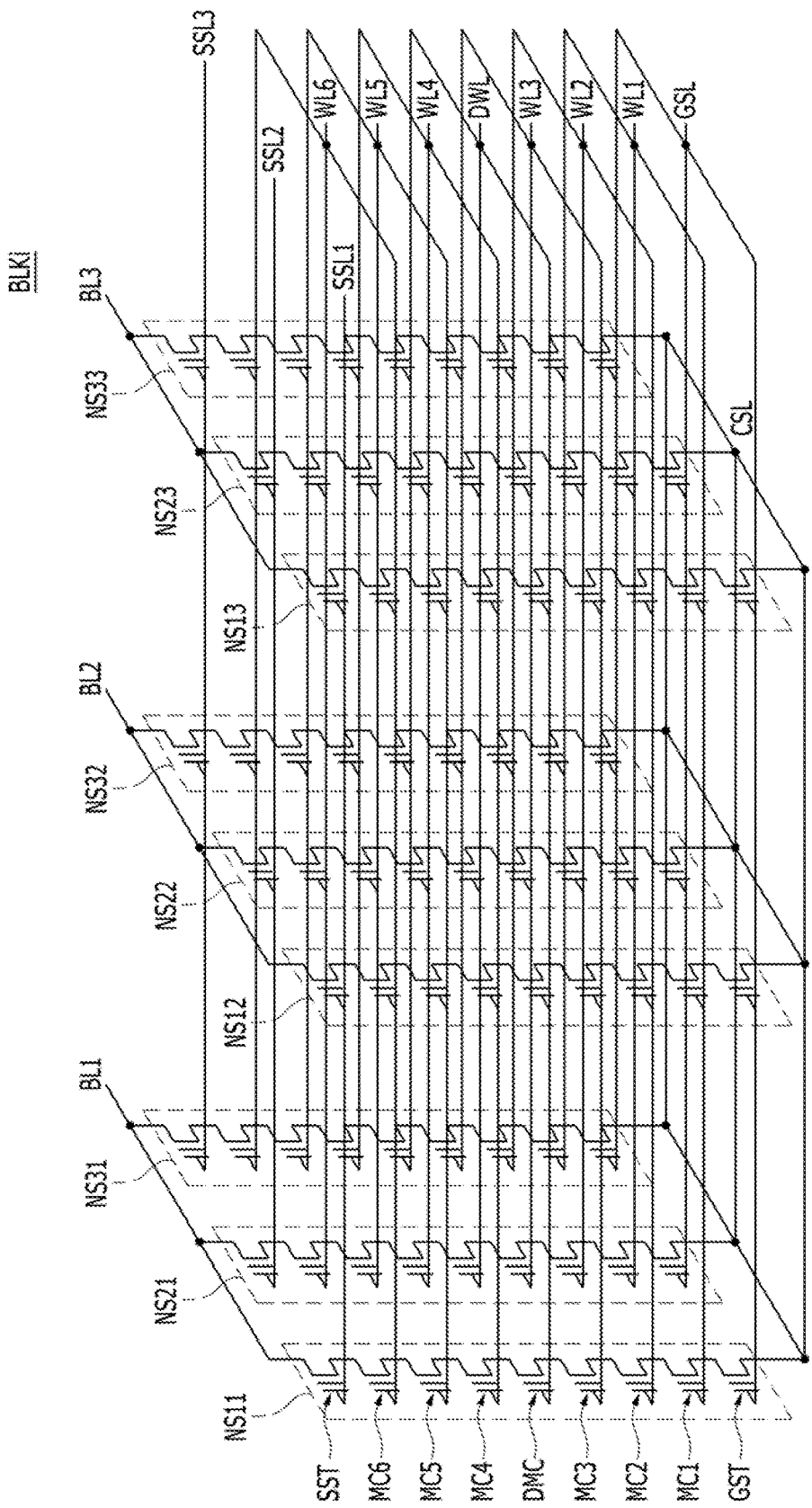

FIG. 8 is an equivalent circuit diagram illustrating the memory block BLKi having a first structure described with reference to FIGS. 5 to 7.

Referring to FIG. 8, in a block BLKi having the first structure, NAND strings NS11 to NS31 may be provided between a first bit line BL1 and a common source line CSL. The first bit line BL1 may correspond to the conductive material 5331 of FIGS. 5 and 6, which extends in the third direction. NAND strings NS12 to NS32 may be provided between a second bit line BL2 and the common source line CSL. The second bit line BL2 may correspond to the conductive material 5332 of FIGS. 5 and 6, which extends in the third direction. NAND strings NS13 to NS33 may be provided between a third bit line BL3 and the common source line CSL. The third bit line BL3 may correspond to the conductive material 5333 of FIGS. 5 and 6, which extends in the third direction.

A source select transistor SST of each NAND string NS may be electrically coupled to a corresponding bit line BL. A ground select transistor GST of each NAND string NS may be electrically coupled to the common source line CSL. Memory cells MC may be provided between the source select transistor SST and the ground select transistor GST of each NAND string NS.

In this example, NAND strings NS may be defined by units of rows and columns, and NAND strings NS which are electrically coupled to one bit line may form one column. The NAND strings NS11 to NS31 which are electrically coupled to the first bit line BL1 may correspond to a first column, the NAND strings NS12 to NS32 which are electrically coupled to the second bit line BL2 may correspond to a second column, and the NAND strings NS13 to NS33 which are electrically coupled to the third bit line BL3 may correspond to a third column. NAND strings NS which are electrically coupled to one source select line SSL may form one row. The NAND strings NS11 to NS13 which are electrically coupled to a first source select line SSL1 may form a first row, the NAND strings NS21 to NS23 which are electrically coupled to a second source select line SSL2 may form a second row, and the NAND strings NS31 to NS33 which are electrically coupled to a third source select line SSL3 may form a third row.

In each NAND string NS, a height may be defined. In each NAND string NS, the height of a memory cell MC1 adjacent to the ground select transistor GST may have a value '1'. In each NAND string NS, the height of a memory cell may increase as the memory cell gets closer to the source select transistor SST when measured from the substrate 5111. In each NAND string NS, the height of a memory cell MC6 adjacent to the source select transistor SST may be 7.

The source select transistors SST of the NAND strings NS in the same row may share the source select line SSL. The source select transistors SST of the NAND strings NS in different rows may be respectively electrically coupled to the different source select lines SSL1, SSL2 and SSL3.

The memory cells at the same height in the NAND strings NS in the same row may share a word line WL. That is, at the same height, the word lines WL electrically coupled to the memory cells MC of the NAND strings NS in different rows may be electrically coupled. Dummy memory cells DMC at the same height in the NAND strings NS of the same row may share a dummy word line DWL. That is, at the same height or level, the dummy word lines DWL electrically coupled to the dummy memory cells DMC of the NAND strings NS in different rows may be electrically coupled.

The word lines WL or the dummy word lines DWL located at the same level or height or layer may be electrically coupled with one another at layers where the conductive materials 5211 to 5291, 5212 to 5292 and 5213 to 5293 which extend in the first direction may be provided. The conductive materials 5211 to 5291, 5212 to 5292 and 5213 to 5293 which extend in the first direction may be electrically coupled in common to upper layers through contacts. At the upper layers, the conductive materials 5211 to 5291, 5212 to 5292 and 5213 to 5293 which extend in the first direction may be electrically coupled. The ground select transistors GST of the NAND strings NS in the same row may share the ground select line GSL. Further, the ground select transistors GST of the NAND strings NS in different rows may share the ground select line GSL. That is, the NAND strings NS11 to NS13, NS21 to NS23 and NS31 to NS33 may be electrically coupled to the ground select line GSL.

The common source line CSL may be electrically coupled to the NAND strings NS. Over the active regions and over the substrate 5111, the first to fourth doping regions 5311 to 5314 may be electrically coupled. The first to fourth doping regions 5311 to 5314 may be electrically coupled to an upper layer through contacts and, at the upper layer, the first to fourth doping regions 5311 to 5314 may be electrically coupled.

As shown in FIG. 8, the word lines WL of the same height or level may be electrically coupled. Accordingly, when a word line WL at a specific height is selected, all NAND strings NS which are electrically coupled to the word line WL may be selected. The NAND strings NS in different rows may be electrically coupled to different source select lines SSL. Accordingly, among the NAND strings NS electrically coupled to the same word line WL, by selecting one of the source select lines SSL1 to SSL3, the NAND strings NS in the unselected rows may be electrically isolated from the bit lines BL1 to BL3. In other words, by selecting one of the source select lines SSL1 to SSL3, a row of NAND strings NS may be selected. Moreover, by selecting one of the bit lines BL1 to BL3, the NAND strings NS in the selected rows may be selected in units of columns.

In each NAND string NS, a dummy memory cell DMC may be provided. In FIG. 8, the dummy memory cell DMC may be provided between a third memory cell MC3 and a fourth memory cell MC4 in each NAND string NS. That is, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into memory cell groups by the dummy memory cell DMC. In the divided memory cell groups, memory cells, for example, MC1 to MC3, adjacent to the ground select transistor GST may be referred to as a lower memory cell group, and memory cells, for example, MC4 to MC6, adjacent to the string select transistor SST may be referred to as an upper memory cell group.

Hereinbelow, detailed descriptions will be made with reference to FIGS. 9 to 11, which show the memory device in the memory system in accordance with an embodiment implemented with a three-dimensional (3D) nonvolatile memory device different from the first structure.

Figure 9:
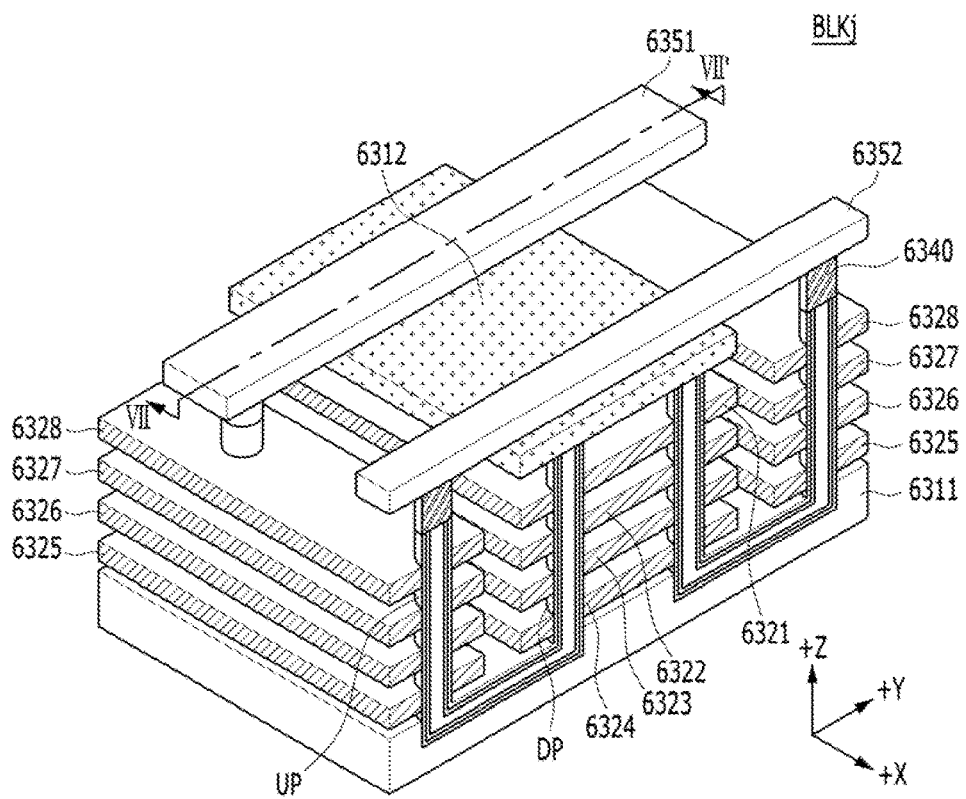

FIG. 9 is a perspective view schematically illustrating the memory device implemented with the three-dimensional (3D) nonvolatile memory device, which is different from the first structure described above with reference to FIGS. 5 to 8, and showing a memory block BLKj of the plurality of memory blocks of FIG. 4. FIG. 10 is a cross-sectional view illustrating the memory block BLKj taken along the line VII-VII' of FIG. 9.

Figure 10:
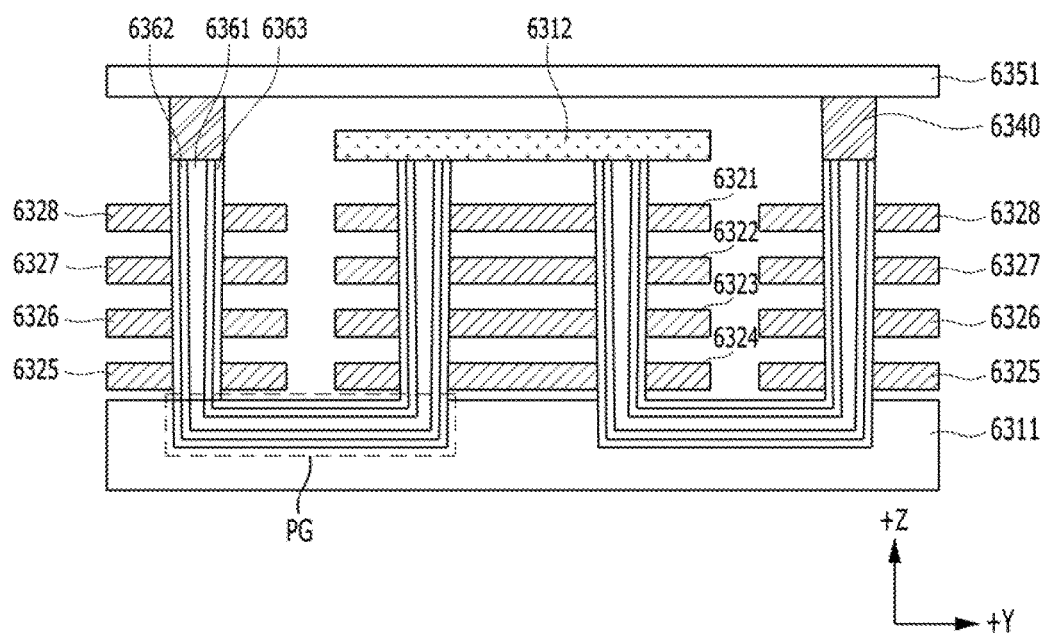

Referring to FIGS. 9 and 10, the memory block BLKj among the plurality of memory blocks of the memory device 150 of FIG. 1 may include structures which extend in the first to third directions.

A substrate 6311 may be provided. For example, the substrate 6311 may include a silicon material doped with a first type impurity. For example, the substrate 6311 may include a silicon material doped with a p-type impurity or may be a p-type well, for example, a pocket p-well, and include an n-type well which surrounds the p-type well. Although in this embodiment the substrate 6311 is p-type silicon, it is to be noted that the substrate 6311 is not limited to being p-type silicon.

First to fourth conductive materials 6321 to 6324 which extend in the x-axis direction and the y-axis direction are provided over the substrate 6311. The first to fourth conductive materials 6321 to 6324 may be separated by a predetermined distance in the z-axis direction.

Fifth to eighth conductive materials 6325 to 6328 which extend in the x-axis direction and the y-axis direction may be provided over the substrate 6311. The fifth to eighth conductive materials 6325 to 6328 may be separated by the predetermined distance in the z-axis direction. The fifth to eighth conductive materials 6325 to 6328 may be separated from the first to fourth conductive materials 6321 to 6324 in the y-axis direction.

A plurality of lower pillars DP which pass through the first to fourth conductive materials 6321 to 6324 may be provided. Each lower pillar DP extends in the z-axis direction. Additionally, a plurality of upper pillars UP which pass through the fifth to eighth conductive materials 6325 to 6328 may be provided. Each upper pillar UP extends in the z-axis direction.

Each of the lower pillars DP and the upper pillars UP may include an internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower pillar DP and the upper pillar UP may be electrically coupled through a pipe gate PG. The pipe gate PG may be disposed in the substrate 6311. For instance, the pipe gate PG may include the same material as the lower pillar DP and the upper pillar UP.

A doping material 6312 of a second type which extends in the x-axis direction and the y-axis direction may be provided over the lower pillars DP. For example, the doping material 6312 of the second type may include an n-type silicon material. The doping material 6312 of the second type may serve as a common source line CSL.

Drains 6340 may be provided over the upper pillars UP. The drains 6340 may include an n-type silicon material. First and second upper conductive materials 6351 and 6352 which extend in the y-axis direction may be provided over the drains 6340.

The first and second upper conductive materials 6351 and 6352 may be separated in the x-axis direction. The first and second upper conductive materials 6351 and 6352 may be formed of a metal. The first and second upper conductive materials 6351 and 6352 and the drains 6340 may be electrically coupled through contact plugs. The first and second upper conductive materials 6351 and 6352 respectively serve as first and second bit lines BL1 and BL2.

The first conductive material 6321 may serve as a source select line SSL, the second conductive material 6322 may serve as a first dummy word line DWL1, and the third and fourth conductive materials 6323 and 6324 serve as first and second main word lines MWL1 and MWL2, respectively. The fifth and sixth conductive materials 6325 and 6326 serve as third and fourth main word lines MWL3 and MWL4, respectively, the seventh conductive material 6327 may serve as a second dummy word line DWL2, and the eighth conductive material 6328 may serve as a drain select line DSL.

The lower pillar DP and the first to fourth conductive materials 6321 to 6324 adjacent to the lower pillar DP form a lower string. The upper pillar UP and the fifth to eighth conductive materials 6325 to 6328 adjacent to the upper pillar UP form an upper string. The lower string and the upper string may be electrically coupled through the pipe gate PG. One end of the lower string may be electrically coupled to the doping material 6312 of the second type which serves as the common source line CSL. One end of the upper string may be electrically coupled to a corresponding bit line through the drain 6340. One lower string and one upper string form one cell string which is electrically coupled between the doping material 6312 of the second type serving as the common source line CSL and a corresponding one of the upper conductive material layers 6351 and 6352 serving as the bit line BL.

That is, the lower string may include a source select transistor SST, the first dummy memory cell DMC1, and the first and second main memory cells MMC1 and MMC2. The upper string may include the third and fourth main memory cells MMC3 and MMC4, the second dummy memory cell DMC2, and a drain select transistor DST.

In FIGS. 9 and 10, the upper string and the lower string may form a NAND string NS, and the NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
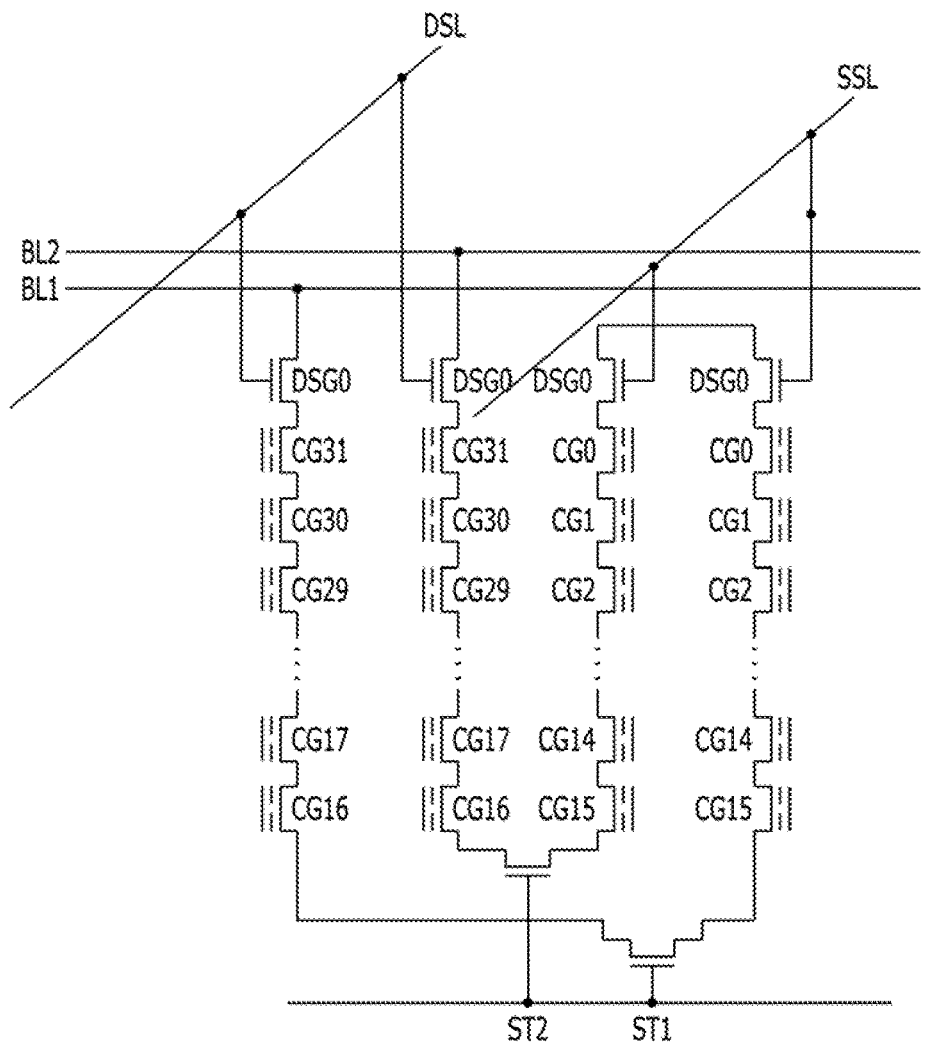

FIG. 11 is a circuit diagram illustrating the equivalent circuit of the memory block BLKj having the second structure as described above with reference to FIGS. 9 and 10. For the sake of convenience, only a first string and a second string, which form a pair in the memory block BLKj in the second structure are shown.

Referring to FIG. 11, in the memory block BLKj having the second structure among the plurality of blocks of the memory device 150, cell strings, each of which is implemented with one upper string and one lower string electrically coupled through the pipe gate PG as described above with reference to FIGS. 9 and 10, may be provided in such a way as to define a plurality of pairs.

That is, in the certain memory block BLKj having the second structure, memory cells CG0 to CG31 stacked along a first channel CH1 (not shown), for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first string ST1 and the second string ST2 may be electrically coupled to the same drain select line DSL and the same source select line SSL. The first string ST1 may be electrically coupled to a first bit line BL1, and the second string ST2 may be electrically coupled to a second bit line BL2.

While it is described in FIG. 11 that the first string ST1 and the second string ST2 are electrically coupled to the same drain select line DSL and the same source select line SSL, it may be envisaged that the first string ST1 and the second string ST2 may be electrically coupled to the same source select line SSL and the same bit line BL, the first string ST1 may be electrically coupled to a first drain select line DSL1 and the second string ST2 may be electrically coupled to a second drain select line DSL2. Further it may be envisaged that the first string ST1 and the second string ST2 may be electrically coupled to the same drain select line DSL and the same bit line BL, the first string ST1 may be electrically coupled to a first source select line SSL1 and the second string ST2 may be electrically coupled a second source select line SSL2.

Hereinafter, data processing in a plurality of memory systems included in the data processing system according to an embodiment will be described in more detail with reference to FIGS. 12 to 14. For example, transmission of a command from the host 102 to the plurality of memory systems and a data processing operation in the plurality of memory systems corresponding to the command received from the host 102 will be described.

Figure 12:
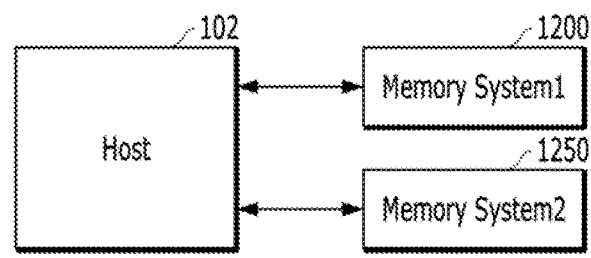
FIG. 12 is a diagram illustrating a data processing system for processing data with a plurality of memory systems in accordance with an embodiment of the present invention.

FIG. 12 is a diagram illustrating a data processing system for processing data in a plurality of memory systems in accordance with an embodiment of the present invention. Hereinafter, for the sake of convenience in explanation, there will be described as an example an operation in which, in a data processing system including a plurality of memory systems (e.g., the memory system 110 shown in FIG. 1), the memory systems (i.e., first and second memory systems) process data in accordance with a command for the memory systems.

Furthermore, in the described embodiment, for the sake of convenience in explanation, there will be described as an example the case where, in the data processing system including the plurality memory systems, the host 102 (in FIG. 1) transmits a command including time information to a first memory system and a second memory system to allow the first and second memory systems to respectively perform corresponding operations including first checking the time information included in the command and then performing the operations corresponding to the received command for the time corresponding to the time information. As such, there will be described as an example an operation in which, according to the time information included in the command, the first memory system and the second memory system perform the command operations. In particular, the first memory system and the second memory system respectively process data according to the command operations for the time corresponding to the time information.

In the described embodiment, each of the first and second memory systems may be embodied by the memory device 150 and the controller 130 which are shown in FIG. 1. In this regard, the first and the second memory systems may be embodied by different type memory devices. For example, the first memory system may include, as a first type memory device, a Hard Disk Drive (HDD), and the second memory system may include, as a second type memory device, a Solid State Drive (SSD).

In other words, with regard to the data processing system according to the described embodiment, in the first memory system, the memory device 150 and the controller 130 shown in FIG. 1 are embodied, in the same manner as a hard disk drive, by a first type memory device and a controller corresponding to the first type memory device. In the second memory system, the memory device 150 and the controller 130 shown in FIG. 1 are embodied, in the same manner as a solid state drive, by a second type memory device and a controller corresponding to the second type memory device. In the described embodiment, for the sake of convenience in explanation, there will be described in more detail as an example the case where the first memory system is a hard disk drive embodied by a first type memory device and the second memory system is a solid state drive embodied by a second type memory device. However, the data processing system according to an embodiment, may comprise first and second memory systems implemented with different type memory devices suitable for performing command operations corresponding to a command received from the host 102 according to time information included in the command and process data.

In the data processing system according to an embodiment, the host 102 checks the number of commands or a data size of command operations that correspond to the first memory system and the second memory system, generates time information, and transmits a command including the time information to the first and second memory systems. In particular, a system included in the host 102 (e.g., a file system or an operating system) checks the number of commands or a data size of command operations that correspond to the first and second memory systems. In other words, the system included in the host 102 checks the numbers of read commands and write commands corresponding to the first memory system and the second memory system, checks a data size of a read operation and a write operation, and generates time information corresponding to the number of commands and the data size. In this regard, the file system or operating system of the host 102 checks commands of the first memory system and the second memory system that are queued in the host 102. In other words, the file system or operating system of the host 102 checks the number of commands that are queued in the host 102 for transmission to the first memory system and the second memory system, and a data size of the command operations, and generates time information corresponding to the number of commands queued in the host 102 and the data size of the command operations.

In the data processing system according to the embodiment, the file system or operating system of the host 102 transmits a command including time information to the first memory system and the second memory system. The first memory system and the second memory system checks the time information included in the command, and then performs command operations corresponding to the command received from the host 102, for the time corresponding to the time information. For example, in the data processing system according to the described embodiment, the first memory system checks the time information of the command received from the host 102, and then performs a map update operation for the time corresponding to the time information. The second memory system checks the time information of the command received from the host 102, and then performs a background operation for the memory device 150 of the second memory system for the time corresponding to the time information.

The first memory system performs, as the map update operation for the first type memory device (e.g., the hard disk drive), an operation of updating and changing only map information without changing data stored in the first type memory device, like an operation of collecting segments of data files included in the hard disk drive. Furthermore, the second memory system performs, as the background operation for the second type memory device (e.g., the solid state drive), a garbage collection (GC) operation, a wear leveling (WL) operation or a map flush operation. The garbage collection operation may include an operation of copying data stored in memory blocks of the memory device to an arbitrary memory block. The wear leveling operation may include an operation of swapping memory blocks of the memory device 150 or data stored in the memory blocks. The map flush operation may include an operation of migrating map data stored in the controller 130 of the second memory system to memory blocks of the memory device 150. Hereinafter, as an example of a data processing operation in the data processing system, an operation of receiving a command from the host 102 and processing data in the first memory system and the second memory system according to time information included in the command, will be described in detail with reference to FIG. 12.

Referring to 12, as described above, the data processing system includes a first memory system 1200 and a second memory system 1250. The first memory system 1200 may include the memory device 150 and the controller 130 of FIG. 1. The first memory system 1200 is coupled to the host 102 and may receive a command from the host 102. The second memory system 1250 may include the memory device 150 and the controller 130 of FIG. 1. The second memory system 1250 may receive a command from the host 102. The memory device included in the first memory system 1200 may be a first type memory device. The memory device included in the second memory system 1250 may be a second type memory device. The first and second types may be different types of memory devices. For example, the first type memory device may be or include a hard disk drive, whereas the second type memory device may be or include a solid state drive.

The host 102 in the data processing system checks a command and data for the first memory system 1200 and a command and data for the second memory system 1250. In particular, a file system or an operating system included in the host 102 may check the number of commands and a data size thereof that are queued in the host 102 for each of the first and second memory systems 1200 and 1250. The number of commands and a data size thereof that are queued in the host 102 for each of the first and second memory systems 1200 and 1250 may be, for example, read and or write commands and related read and write data. The file system or the operating system included in the host 102 may generate time information for each of the first and second memory systems 1200 and 1250 in accordance with the number of commands and related data size for each of the first and second memory systems 1200 and 1250. The host may 102 transmit a command including related generated time information, to each of the first and second memory systems 1200 and 1250.

The command that includes the time information and is transmitted from the host 102 to each of the first and second memory systems 1200 and 1250 may be hereinafter referred to as an operation command. The operation command may be a command to perform update operations for the first memory system 1200 and the second memory system 1250. The first memory system 1200 and the second memory system 1250 upon receiving the operation command from the host 102 may then each perform respective update operations, for the time corresponding to the time information.

In an embodiment, the file system or the operating system of the host 102 checks the number of commands including a read command and a write command queued in the host 102, for the first memory system 1200 and the second memory system 1250, and a data size including read data and write data corresponding to the read command and the write command, and thereafter generates time information in accordance with the number of commands and the data size and transmits the operation command including the time information, to each of the first memory system 1200 and the second memory system 1250.

The file system or the operating system included in the host 102 may check the types of the memory devices included in the first memory system 1200 and the second memory system 1250. For example, the file system or the operating system may check what is the type of the first type memory device and the second type memory device that are included in the first memory system 1200 and the second memory system 1250, respectively. The file system and or the operating system may generate operation commands including operation information indicating update operations corresponding to the types of the memory devices 150, and then transmit the operation commands to the first memory system 1200 and the second memory system 1250, respectively. For example, the operations may include a map update operation and a background operation. That is, the file system or operating system included in the host 102 may transmit the operation commands including the time information and the operation information, to the first memory system 1200 and the second memory system 1250, respectively.

In this regard, when receiving, from the host 102, a read command or write command queued in the host 102, each of the first memory system 1200 and the second memory system 1250 performs a read operation or write operation corresponding to the read command or write command. When receiving, from the host 102, an operation command including time information, each of the first and second memory systems 1200 and 1250 may check the operation command, and the operation and/or time information which may be included in the operation command. Thereafter, each of the first and second memory systems 1200 and 1250 perform update operations as the command operations corresponding to the operation command, for the time corresponding to the time information. For example, the first and second memory systems 1200 and 1250 may each perform a map update operation and a background operation.

For example, in more detail, the first memory system 1200 when it receives an operation command from the host 102 checks the operation command, and operation Information and/or time Information included in the operation command. Then, the first memory system 1200 performs an update operation as a command operation corresponding to the operation command for the time corresponding to the time information. In other words, the first memory system 1200 performs a map update operation. In this regard, the first memory system 1200 updates, as the map update operation corresponding to the operation command, map data for the memory device 150 included in the first memory system 1200. For example, as described above, in the case where the first type memory device is included in the first memory system 1200, map data for the first type memory device is changed and updated. In other words, map information including physical location Information is changed and updated.

In this regard, when receiving an operation command from the host 102, the first memory system 1200 including the first type memory device checks the operation command, and operation information and/or time information that are included in the operation command, and performs an update operation as a command operation corresponding to the operation command for the time corresponding to the time information. That is, the first memory system 1200 may rearrange Logical Block Address (LBA) Information as physical location Information of map information for the first type memory device, and may thus update the map data. In this way, the first memory system 1200 performs, after having received an operation command from the host 102, an update operation in accordance with time information included in the operation command. That is, the first memory system 1200 updates the map data, and thus successively rearranges map information for the first type memory device included in the first memory system 1200. Thereby, the performance of a read operation or write operation corresponding to a read command or write command received from the host 102 can be enhanced. For example, an operation for searching and checking map information for performing the read operation or write operation can be performed more rapidly, whereby the performance of the read operation or write operation can be enhanced.

As described above, the first memory system 1200 performs the update operation corresponding to the operation command received from the host 102. Then, the first memory system 1200 transmits, as a response signal for the operation command, a completion signal indicating that the update operation corresponding to the operation command has been completed, to the host 102. For example, the first memory system 1200 transmits the response signal for the operation command to the file system or operating system included in the host 102.

A data processing system, according to an embodiment of the present invention, may include first and second memory systems 1200 and 1250 wherein the first memory system 1200 includes a first type memory device and a controller for the first type memory device. The first memory system 1200 may include, for example, the memory device 150 and the controller 130 of FIG. 1. After the controller 130 of the first memory system 1200 receives an operation command from the host 102, the first memory system 1200 checks the operation command, and operation information and/or time information that are included in the operation command, performs an update operation corresponding to the operation command for the time corresponding to the time information, and transmits a completion signal indicating that the update operation for the operation command has been completed, to the host 102.

Moreover, the second memory system 1250 upon receiving an operation command from the host 102 checks the operation command, and operation information and/or time information that are included in the operation command. Then, the second memory system 1250 performs an update operation as a command operation corresponding to the operation command for the time corresponding to the time information. The second memory system 1250 performs, for example, a background operation. The second memory system 1250 may for example, perform a background operation for the memory device 150 included in the second memory system 1250. In the case where the second type memory device is included in the second memory system 1250, as described above, the second memory system 1250 may perform a background operation for the second type memory device.

In an embodiment, when receiving an operation command from the host 102, the second memory system 1250 including the second type memory device checks the operation command, and operation information and/or time information that are included in the operation command. Then, the second memory system 1250 performs an update operation as a command operation corresponding to the operation command for the time corresponding to the time information. For example, the second memory system 1250 may perform a background operation for the second type memory device. The background operation may include the second memory system 1250 performing an operation of copying data stored in memory blocks of the memory device 150 to an arbitrary memory block (i.e., a garbage collection operation), or an operation of swapping memory blocks of the memory device 150 or data stored in the memory blocks (i.e., a wear leveling operation), or an operation of storing map data stored in the controller 130 of the second memory system into the memory blocks of the memory device 150 (i.e., a map flush operation).

In particular, taking into account the amount of processing background operations required for the second type memory device (i.e., a workload by background operations), and the order of priority of the background operations required for the second type memory device, the second memory system 1250 may select a background operation capable of being performed for the time corresponding to the time information, and perform the selected background operation for the time corresponding to the time information. For example, in an embodiment wherein three background operations correspond to an operation command, the second memory system 1250 may check, among the three background operations corresponding to the operation command received from the host 102, a workload of a first background operation (e.g., a garbage collection operation), a workload of a second background operation (e.g., a wear leveling operation), and a workload of a third background operation (e.g., a map flush operation). Furthermore, the second memory system 1250 checks the order of priority for the background operations corresponding to the operation command received from the host 102. For example, the second memory system 1250 may check whether a background operation should be preferentially performed. For example, among a garbage collection operation, a wear leveling operation, and a map flush operation, the garbage collection operation may be the first priority background operation, the wear leveling operation may be the second priority operation, and a map flush operation may be the third priority background operation.

Furthermore, the second memory system 1250 checks the amount of processing background operations that can be performed in accordance with the time information of the operation command received from the host 102. In other words, the second memory system 1250 checks a workload capable of being processed for the time corresponding to the time information, and selects a background operation, taking into account workloads and the order of priority of the background operations for the second type memory device and a workload capable of being processed for the time corresponding to the time information. Then, the second memory system 1250 performs the selected background operation for the time corresponding to the time information.

In this regard, the second memory system 1250 selects a background operation, taking into account workloads of background operations and a workload capable of being processed for the time corresponding to the time information. In other words, the second memory system 1250 selects, among the background operations, a background operation capable of being performed for the time corresponding to the time information. In particular, the second memory system 1250 selects background operations that are possible to be completed. In this case, for the time corresponding to the time information, in sequence according to the order of priority, the second memory system 1250 selects a background operation having the highest priority (or first priority) and performs the background operation. Then, the second memory system 1250 selects a background operation having the next highest priority (or second priority) and performs the background operation. Furthermore, taking into account workloads of background operations, in the case where there is no background operation that is possible to be completed for the time corresponding to the time information, the second memory system 1250 selects, according to the order of priority, a background operation having the highest priority and performs the selected background operation for the time corresponding to the time information. If the time corresponding to the time information is ended while the selected background operation is performed, the second memory system 1250 stops the background operation that is being performed, and reperforms, at a next time capable of performing the background operation, the stopped background operation.

For example, in more detail, it may be assumed that, among the described background operations including the garbage operation, the wear leveling operation, and the map flush operation, the workload of the map flush operation is smallest and the workload of the wear leveling operation is largest according to a workload, and the garbage collection operation is the most significant background operation (highest or first priority) and the map flush operation is the least significant background operation (lowest priority) according to the order of priority. Under this assumption, the second memory system 1250 that has received an operation command from the host 102 selects the optimal background operation according to the workload and the order of priority for the time corresponding to the time information included in the command. For example, in the case where only a map flush operation having the least workload is present as a background operation that is possible to be completed for the time corresponding to the time information according to a workload, the second memory system 1250 selects the map flush operation and performs the background operation for the time corresponding to the time information. In the case where a map flush operation and a garbage collection operation are present, for the time corresponding to the time information, according to the order of priority, the second memory system 1250 selects and performs the garbage collection operation, and then selects and performs the map flush operation. Furthermore, in the case where there is no background operation that is possible to be completed for the time corresponding to the time Information according to a workload, the second memory system 1250 selects, according to the order of priority, a garbage collection operation and performs the background operation for the time corresponding to the time Information. If the time corresponding to the time information is ended while the garbage collection operation is performed, the second memory system 1250 stops the garbage collection operation that is being performed, and reperforms, at a next time capable of performing the background operation, the stopped garbage collection operation.

In this regard, when receiving an operation command from the host 102, the second memory system 1250 including the second type memory device checks the operation command, and the operation information and/or time information included in the operation command, and performs, for the time corresponding to the time information, a background operation for the second type memory device as a command operation corresponding to the operation command. In other words, for the time for which the first memory system 1200 including the first type memory device performs an update operation of successively rearranging the LBA information, the second memory system 1250 performs, as the background operation for the second type memory device, the garbage collection operation, the wear leveling operation, the map flush operation, etc. As such, the second memory system 1250 performs the background operation by performing, after receiving an operation command from the host 102, an update operation in accordance with the time information included in the operation command. Therefore, the reliability and use efficiency of the second type memory device included in the second memory system 1250 are enhanced.

Further, as described above, the second memory system 1250 performs the update operation corresponding to the operation command received from the host 102 (i.e., the background operation), and thereafter transmits, as a response signal for the operation command, a completion signal indicating that the update operation (i.e., the background operation) corresponding to the operation command has been completed, to the host 102. For example, the second memory system 1250 transmits the completion signal to the file system or operating system included in the host 102. In this regard, in the case where there is no background operation that is possible to be completed according to a workload for the time corresponding to the time information included in the operation command, the second memory system 1250 performs a background operation selected according to the order of priority only for the time corresponding to the time information and then stops the background operation. In this case, since the background operation that is being performed is normally stopped, the second memory system 1250 transmits a completion signal to the host 102 and reperforms, for a next time for which the background operation is possible, the stopped background operation.

That is, in the data processing system according to an embodiment, the second memory system 1250 may include the second type memory device and the controller for the second type memory device (i.e., the memory device 150 and the controller 130 of FIG. 1). After the controller 130 of the second memory system 1250 receives an operation command from the host 102, the second memory system 1250 checks the operation command, and operation information and/or time information included in the operation command. Then, the second memory system 1250 performs an update operation corresponding to the operation command for the time corresponding to the time information, and transmits a completion signal indicating that the update operation for the operation command has been completed, to the host 102.

In an embodiment, the file system or operating system included in the host 102 checks the number of commands or the data size of command operations for the first memory system 1200 including the first type memory device and the second memory system 1250 including the second type memory device, and generates time information. Furthermore, the file system or operating system transmits an operation command including operation information and/or time information corresponding to the first type memory device and the second type memory device, to the first memory system 1200 and the second memory system 1250, respectively. Each of the first memory system 1200 and the second memory system 1250 receives the operation command from the host 102. The first memory system 1200 including the first type memory device checks the operation command and the operation information and/or time information, and performs an update operation corresponding to the operation command for the time corresponding to the time information. That is, the first memory system 1200 performs an operation of updating map data for the first type memory device. For example, the first memory system 1200 performs an operation of updating the map data by successively rearranging LBA information. The second memory system 1250 including the second type memory device checks the operation command and the operation information and/or time information. Then, the second memory system 1250 performs an update operation corresponding to the operation command for the time corresponding to the time information, while the first memory system 1200 performs the operation of updating the map data. That is, the second memory system 1250 performs a background operation for the second type memory device. For example, the second memory system 1250 selects and performs a garbage collection operation, a wear leveling operation, a map flush operation, taking into account a workload and the order of priority by background operations.

As described, a data processing system, according to an embodiment includes, a first memory system and a second memory system which may perform, for the time corresponding to the time information included in the operation command, the update operations. As the operation of updating the map data is performed, the operation performance of the first memory system 1200 including the first type memory device is enhanced. Also, as the background operation is performed, the memory use efficiency and performance of the second memory system 1250 including the second type memory device are enhanced. Hereinafter, an operation of processing data in the memory system according to the embodiment will be described in detail with reference to FIGS. 13 and 14.

Figure 13:
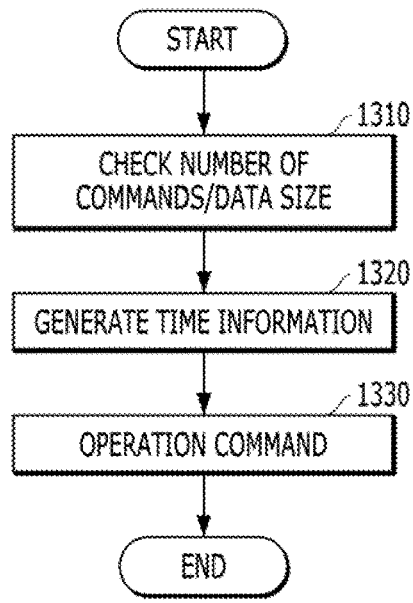
FIGS. 13 and 14 are flowcharts illustrating an operating process of processing data in a data processing system in accordance with an embodiment of the present invention.
Figure 14:
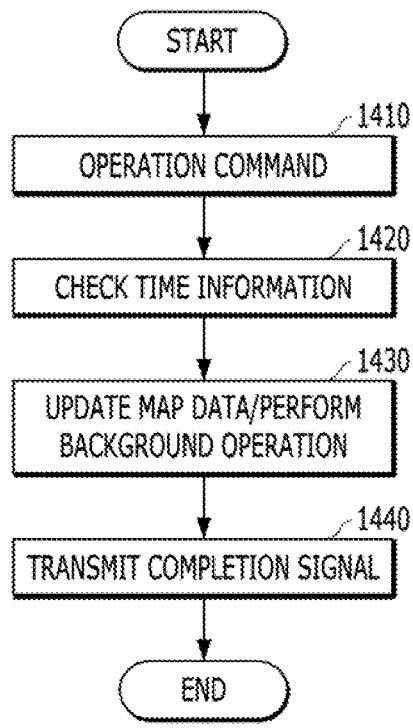

FIGS. 13 and 14 are diagrams illustrating examples of an operation process of processing data in the data processing system in accordance with the embodiment of the present invention. For example, the process of FIG. 13 may be performed by the host 102 of the processing system in FIG. 12, and the process of FIG. 14 may be performed by the memory systems 1200 and 1250 of the processing system in FIG. 12.

Referring to FIG. 13, at step 1310, the host of the data processing system checks the number of commands, a data size of command operations, or the like for the first memory system including the first type memory device and the second memory system including the second type memory device in the data processing system. In particular, the file system or operating system included in the host may check the number of commands, and/or a data size of command operations.

At step 1320, the host generates time information in accordance with the number of commands and the data size for the first memory system and the second memory system.

Thereafter, at step 1330, the host transmits an operation command including operation information and/or time information corresponding to the first memory system including the first type memory device and the second memory system including the second type memory device, to each of the first and the second memory systems.

The operation in which the host generates the time information for the first memory system including the first type memory device and the second memory system including the second type memory device and then transmits the operation command including the time information and operation information to the first memory system and the second memory system, has been described in detail with reference to FIG. 12, and, therefore, detailed description thereof will be omitted.

Thereafter, referring to FIG. 14, at step 1410, the first memory system and the second memory system of the data processing system receive (e.g., from the host) the operation command including the time information and the operation information. For example, the first memory system may include the first type memory device, and the second memory system may include the second memory device. In this regard, as described above, the operation command includes the operation information corresponding to the first memory system including the first type memory device and the second system including the second type memory device, and the time information corresponding to the number of commands or the data size of the command operation, for the first memory system including the first type memory device and the second system including the second type memory device.

At step 1420, the first memory system and the second memory system check the operation command, and the time information and operation information included in the operation command. In particular, the first memory system and the second memory system check the time information, and then checks the time for which the command operation corresponding to the operation command is performed.

At step 1430, the first memory system and the second memory system perform update operations as command operations corresponding to the operation command, for the time corresponding to the time Information. For instance, the first memory system performs an operation of updating map data as an update operation corresponding to the operation command. The second memory system performs a background operation as an update operation corresponding to the operation command. In this regard, the first memory system including the first type memory device performs the update operation by successively rearranging map information (e.g., LBA information) for the first type memory device, for the time corresponding to the time information included in the operation command. The second memory system including the second type memory device performs, as the background operation for the second type memory device, a garbage collection operation, a wear leveling operation, a map flush operation, etc. for the time information included in the operation command. For example, the second memory system performs the background operation for the second type memory device, while the first memory system performs the operation of updating the map information.

At step 1440, for the time corresponding to the time information, the first memory system and the second memory system perform, as the command operations corresponding to the operation command, the update operation (i.e., the operation of updating the map data), and the background operation. Thereafter, each of the first and second memory systems transmits, as a response signal for the operation command, a completion signal indicating that the update operation corresponding to the operation command has been completed, to the host.

A process in which the first memory system and the second memory system upon receiving the operation command from the host perform an update operation for the time corresponding to the time information included in the operation command, for example, update map data for the first type memory device, and perform a background operation for the second type memory device has already been described in detail above. Therefore, detailed description thereof will be now omitted.

As described above, a data processing system and an operating method of the data processing system in accordance with various embodiments of the present invention reduce the complexity and performance deterioration of memory systems, rapidly and stably process data in the memory systems, and increase the use efficiency of the memory systems.

Although various embodiments have been described for Illustrative purposes, it will be apparent to those skilled in the art that various changes and modifications may be made without departing from the spirit and scope of the disclosure as defined in the following claims.

What is claimed is:

1. A data processing system comprising:
   a first memory system including a first memory device, and a first controller; and
   a second memory system including a second memory device, and a second controller,
   wherein the first memory system receives an operation command including time information from a host, checks the time information and performs a first update operation for the first memory device during a first time corresponding to the time information, and
   wherein the second memory system performs a second update operation for the second memory device during the first time for which the first update operation is performed
   wherein the second update operation includes an operation of selecting, among a plurality of background operations for the second memory devices, at least one background operation, and performing the at least one background operation,
   wherein the second memory system selects the at least one background operation based on the workloads and the order of priority for the background operations,
   wherein the second memory system selects, among the background operations, a first background operation and a second background operation that are to be completed during the first time, in accordance with the workloads, and
   wherein the second memory system performs, in accordance with the order of priority, the first background operation having a relatively high priority and then performs the second background operation having a relatively low priority.

2. The data processing system according to claim 1, wherein the first update operation includes an operation of updating map information for the first memory device by successively rearranging Logical Block Address (LBA) information for the first memory device.

3. The data processing system according to claim 1,
   wherein in the case where, among the background operations, there is no background operation to be completed during the first time in according to the workloads, the second memory system selects a first background operation having the highest priority in accordance with the order of priority, and
   wherein the second memory system performs the first background operation during the first time.

4. The data processing system according to claim 1, wherein the second memory system stops the first background operation when the first time is ended, and performs, for a next time capable of performing the second update operation, the stopped first background operation.

5. The data processing system according to claim 1, wherein the background operations include a garbage collection operation, a wear leveling operation, and a map flush operation.

6. The data processing system according to claim 1,
   wherein the host is suitable for:
   checking the number of commands and a data size of command operations for the first memory system and the second memory system,
   generating the time information corresponding to the number of commands and the data size, and
   transmitting the operation command including operation information for the first and second memory systems and the time information, to each of the first and second memory systems.

7. The data processing system according to claim 1, wherein the second memory system receives the operation command from the host, checks the time information, and performs the second update operation during the first time.

8. An operating method of a data processing system comprising:
   transmitting a command including time information from a host to a first memory system including a first memory device and a first controller, and to a second memory system including a second memory device and a second controller;
   checking the time information; and
   performing a first update operation for the first memory device during a first time corresponding to the time information, and a second update operation for the second memory device during the first time for which the first update operation is performed,
   wherein the second update operation includes an operation of selecting, among a plurality of background operations for the second memory devices, at least one background operation, and performing the at least one background operation, wherein the performing of the second update operation comprises:

checking workloads and an order of priority for the background operations, and selecting the at least one background operation based on workloads and an order of priority for the background operations, wherein the performing of the second update operation comprises:

selecting, among the background operations, a first background operation and a second background operation that are to be completed during the first time, in accordance with the workloads; and performing, in accordance with the order of priority, the first background operation having a relatively high priority, and then performing the second background operation having a relatively low priority.

9. The operating method according to claim 8, wherein the first update operation includes an operation of updating map information for the first memory device by successively rearranging Logical Block Address (LBA) information for the first memory device.

10. The operating method according to claim 8, wherein the performing of the second update operation comprises:

selecting, in the case where, among the background operations, there is no background operation capable of being completed during the first time in according to the workloads, a first background operation having the highest priority in accordance with the order of priority; and performing the first background operation during the first time.

11. The operating method according to claim 8, further comprising:

stopping the first background operation when the first time is ended; and performing, for a next time capable of performing the second update operation, the stopped first background operation.

12. The operating method according to claim 8, wherein the background operations include a garbage collection operation, a wear leveling operation, and a map flush operation.

13. The operating method according to claim 8, further comprising:

checking the number of commands and a data size of command operations for the first memory system and the second memory system; and generating the time information corresponding to the number of commands and the data size.

14. The operating method according to claim 8, wherein the transmitting of the command comprises transmitting the command including operation information and the time information for the first memory system and the second memory system, to each of the first and second memory systems.

* * * * *